US008071165B2

(12) United States Patent
Kapur et al.

(10) Patent No.: US 8,071,165 B2

(45) Date of Patent: Dec. 6, 2011

(54) CHEMICAL VAPOR DEPOSITION METHOD AND SYSTEM FOR SEMICONDUCTOR DEVICES

(75) Inventors: Vijay K. Kapur, Tarzana, CA (US); Richard T. Kemmerle, Dove Canyon, CA (US); Phucan Le, Sylmar, CA (US)

(73) Assignee: International Solar Electric Technology, Inc., Chatsworth, CA (US)

( * ) Notice: Subject to any disclaimer, the term of this patent is extended or adjusted under 35 U.S.C. 154(b) by 582 days.

(21) Appl. No.: 12/188,468

(22) Filed: Aug. 8, 2008

(65) Prior Publication Data

US 2010/0035432 A1 Feb. 11, 2010

(51) Int. Cl.
*C23C 16/00* (2006.01)

(52) U.S. Cl. ................................ 427/248.1; 427/255.23

(58) Field of Classification Search ............... 427/248.1, 427/255.23

See application file for complete search history.

(56) References Cited

U.S. PATENT DOCUMENTS 6,974,976 B2 * 12/2005 Hollars ........................ 257/184
2009/0203194 A1 * 8/2009 Tanaka .......................... 438/478

FOREIGN PATENT DOCUMENTS

EP 1168420 A2 1/2002
EP 1860685 A1 11/2007
WO 2006123870 A1 11/2006

* cited by examiner

*Primary Examiner* — Kelly M Gambetta
(74) *Attorney, Agent, or Firm* — Fulwider Patton LLP

(57) ABSTRACT

A method of and system for chemical vapor deposition of layers of material on substrates for producing semiconductor devices provides for continuous in-line processing. The method includes continuously conveying a plurality of substrates through a plurality of in-line deposition regions, continuously providing and distributing a chemical vapor at each region to deposit material for the layer, and continuously supplying a flow of chemical material for each region to provide the chemical vapor. The system includes a continuous in-line substrate conveyance apparatus for moving a plurality of substrates through a plurality of deposition regions, a deposition head for providing and distributing a chemical vapor at each of the regions to deposit material for the layers, and a chemical material supply apparatus for providing a flow of chemical materials to each of the heads for the chemical vapor.

33 Claims, 9 Drawing Sheets

34
116 44 118 116 120
126 122 124

CHEMICAL VAPOR DEPOSITION METHOD AND SYSTEM FOR SEMICONDUCTOR DEVICES

FIELD OF THE INVENTION

This invention relates to methods and systems for the chemical vapor deposition of layers of material on substrates, and in particular, such deposition for producing semiconductor devices.

BACKGROUND OF THE INVENTION

Solar cells, of course, are semiconductor devices that have been the subject of substantial developmental effort over the years, including among many other aspects, improving their conversion efficiency and improving the methods and apparatus for producing solar cells at lower cost. These efforts have only been enhanced in recent years, with great concern and emphasis on attempting to progress toward parity in the cost of electricity generation by solar cells with traditional sources of electric power generation.

The use of silicon-based semiconductor material for solar cells has an extended history. However, the material and manufacturing costs of such solar cells are relatively high. Therefore, it is very difficult to achieve parity in electric power generation using silicon-based solar cells, in comparison to costs related to traditional sources of electrical energy. One important approach to overcoming these difficulties has been the effort directed to develop low cost, thin film solar cells. These efforts include concern with the process of making large area thin film solar cells, using amorphous and polycrystalline semiconductor material, by methods that are more cost effective and have increased material utilization. More specifically, the manufacturing of large area thin film solar cells, with a required conversion efficiency, in a cost effective way, has proven an extremely great challenge.

In manufacturing thin film solar cells, various layers of electronically active material are provided on a base (of one or more layers) of choice, to achieve a desired solar cell structure. One example of an electronically active layer that is often used is a zinc oxide (ZnO) layer that is generally transparent to the solar radiation of concern and that is also electronically conductive. The challenge for a layer such as this, as for a number of other formed layers, is the need to control its composition, its electronic and optical properties and its uniformity, over a large area substrate, while maintaining a significant rate of production.

Despite the desire for increased rates of production, due to the other concerns and problem areas, the choice of methods and systems for forming the electronically active, thin film solar cell layers, emphasize batch processing—i.e., production of one or a number of units in an apparatus, removing them, and replacing them with the next unit or group of units.

For the fabrication of thin film semiconductor devices, both physical vapor deposition (commonly abbreviated "PVD") techniques, and chemical vapor deposition (common abbreviated "CVD") techniques, have been employed. In regard to physical vapor deposition, prior, known methods employ Rf (radio frequency) magnetron sputtering in a continuous processing mode to form ZnO material layers—with units, one after the other, moving continuously along a sputter deposition path. However, the ceramic ZnO material targets used in this sputtering process are quite expensive, and the deposition rates for the ZnO material layers are quite low. Thus, to achieve desired production rates, typically, a large number of ZnO material targets are required, making the sputtering system relatively large and expensive.

Turning to the technique of chemical vapor deposition, prior, known efforts have been directed at devices that provide an enhanced area of distribution of chemical vapor for deposition. This, of course, thus, is directed to enhanced area solar cells. For example, for applying two separate material vapors, e.g., separately carried by a gas, such devices would typically provide separate conduit structures for each, with one supplying a set of generally parallel conduit structures having openings along their lengths, and the other supplying another such set that alternates in position with the conduits of the first set. Rather than alternate generally parallel conduits, a variation employs one set of conduits extending outwardly from a central area and another alternating set extending outwardly from that area. That variation, thus, is in the nature of a "sunburst" array. Each of these has been of limited usefulness.

SUMMARY OF THE INVENTION

In accordance with the invention, a method of chemical vapor deposition of layers of material on substrates for producing semiconductor devices, includes the steps of continuously conveying a plurality of substrates through a plurality of in-line deposition regions, continuously providing and distributing a chemical vapor at each of the regions to deposit material for the layers, and continuously supplying a flow of chemical materials for each of the regions to provide the chemical vapor.

The chemical vapor for deposition at each of the regions may cover an area greater than or equal to about 81 $in^2$ (523 $cm^2$), each of the substrates may have an area for the deposition of greater than or equal to that size, and the deposited layers of material may have a thickness of greater than or equal to about 0.1 micrometer (0.0039 mil) and less than or equal to about 3.0 micrometer (0.12 mil).

The pressure at the deposition surface of each of the plurality of substrates at the deposition regions may be greater than equal to about 0.5 torr and less than or equal to about 2.5 torr, and the temperature at the deposition surface of each of the plurality substrates at the deposition regions may be greater than or equal to about 100° C. and less than or equal to about 450° C.

The chemical vapor may include an organometallic material, such as diethyl zinc vapor ($Zn(C_2H_5)_2$) or dimethyl zinc vapor ($Zn(CH_3)_2$). The chemical vapor may also include materials such as water vapor ($H_2O$), nitrous oxide gas (NO), or hydrogen sulfide gas ($H_2S$). Also, the atmosphere for the chemical vapor for one or more of the regions may include a material that provides a dopant for the layers, such as boron. Thus, the layers of material may include zinc oxide doped with boron.

Further in accordance with the invention, a system for chemical vapor deposition of layers of material on substrates for producing semiconductor devices, includes a continuous in-line substrate conveyance apparatus for moving a plurality of substrates through a plurality of deposition regions, a deposition head for providing and distributing a chemical vapor at each of the regions to deposit material for the layers, and a chemical material supply apparatus for providing a flow of chemical materials to each of the heads for the chemical vapor.

Each deposition head may include an emission and distribution face at the region for that head, and wall structure defining a first plenum layer having a first plenum and a second plenum layer having a second plenum, for receiving chemical materials from the supply apparatus and for maintaining separation of received chemical materials. Each head may also include wall structure defining a third plenum layer having a first set of elongated plenums for receiving chemical material from the first plenum and distributing such material to the emission and distribution face, and second set of elongated plenums for receiving chemical material from the second plenum and distributing such material to the emission and distribution face. The first set of elongated plenums and the second set of elongated plenums may have alternating positions in the third plenum layer.

In an embodiment in accordance with the invention, a first set of flow path structures provides a first set of sealed flow paths from the first plenum to the first set of elongated plenums of the third plenum layer, and other structure provides a second set of sealed flow paths from the second plenum to the second set of elongated plenums of the third plenum layer. This first set of flow path structures then provides at least two sealed flow paths from the first plenum to each plenum of the first set of elongated plenums of the third plenum layer, and the other structure provides at least two sealed flow paths from the second plenum to each of the second set of elongated plenums of the third plenum layer.

The foregoing and additional features and advantages of this invention will become further apparent from the detailed description and accompanying drawing figures that follow. In the figures and written description, numerals indicate the various features of the invention, like numerals referring to like features throughout for the drawing figures and the written description.

DETAILED DESCRIPTION OF THE PREFERRED EMBODIMENTS

Figure 1:
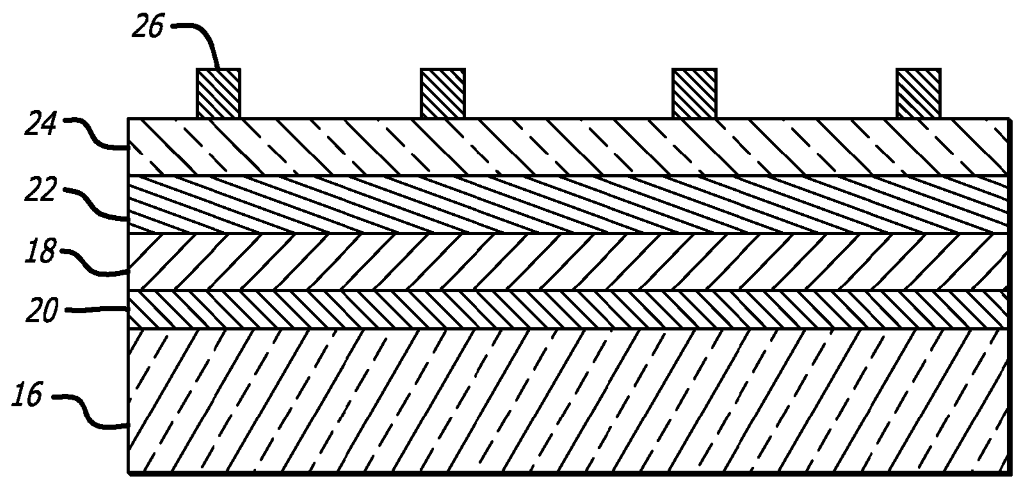
FIG. 1 is a cross-sectional view of a solar cell made in accordance with the present invention.

A typical general structure of a thin film solar cell, as well as one that may be made by using the method and system of the present invention, is shown in FIG. 1. The device is fabricated on a base that includes a sub-layer 16, that may typically be made, as shown, of a glass material, or alternatively of other material, such as a polymer, a suitable ceramic material, or a metal foil. A p-type absorber film 18 is deposited over a conductive layer 20, e.g., a metallic layer made of molybdenum (Mo), which acts as the back ohmic contact to the solar cell, and which is a coating for the sub-layer of the base. The sub-layer 16 and its coating 20, thus, may together be regarded as a base.

An n-type film 22 is formed on the p-type film. This, of course, forms a p-n junction that is critical to the performance of such a solar cell. Then, a window layer 24, generally transparent to the solar radiation of concern, is formed, through which radiation enters the device. The solar cell may be completed by depositing a metallic grid finger pattern 26 over the window layer, if needed.

Among a variety of well-known choices which have been the subject of significant work and literature over the years, one general example would have the p-type layer made of a Group IB-IIIA-VIA compound, such as one made of copper (Cu), along with indium and/or gallium (In, Ga), along with sulfur and/or selenium (S, Se). With the choice of copper, indium, gallium and sulfur, cadmium sulfur (CdS) is one typical choice for the n-type layer. Additionally, a zinc oxide (ZnO) material is a popular choice for the transparent window layer 24.

The method and system of the invention is particularly directed to the formation of the transparent window layer 24, formed after the p-type and n-type layers are deposited, which should not negatively affect those layers or the junction. However, since the method and system has applicability to a variety of other layers made of other chemical constituents, it does have a much wider range of applicability.

Figure 2:
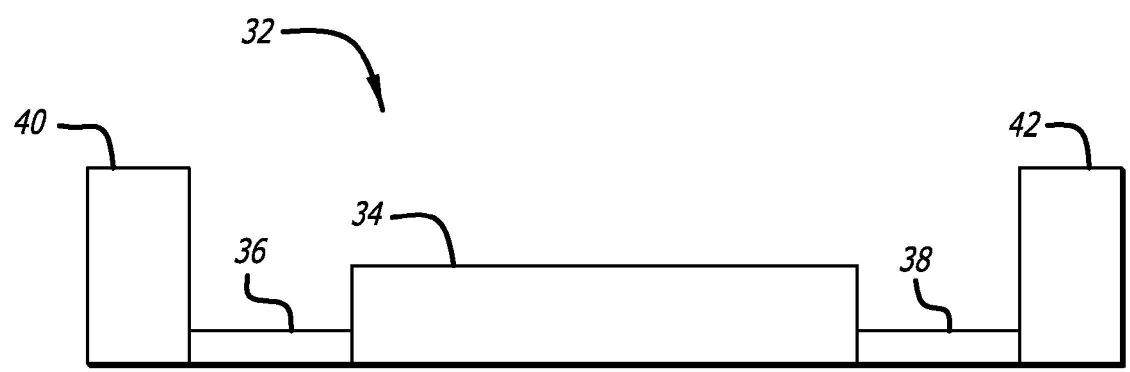
FIG. 2 is a schematic drawing showing the arrangement of a stack loader, a load/preheat section, a deposition section, an unload and cooling section, and a stack unloader, for a processing line of a chemical vapor deposition system in accordance with the invention.
Figure 3:
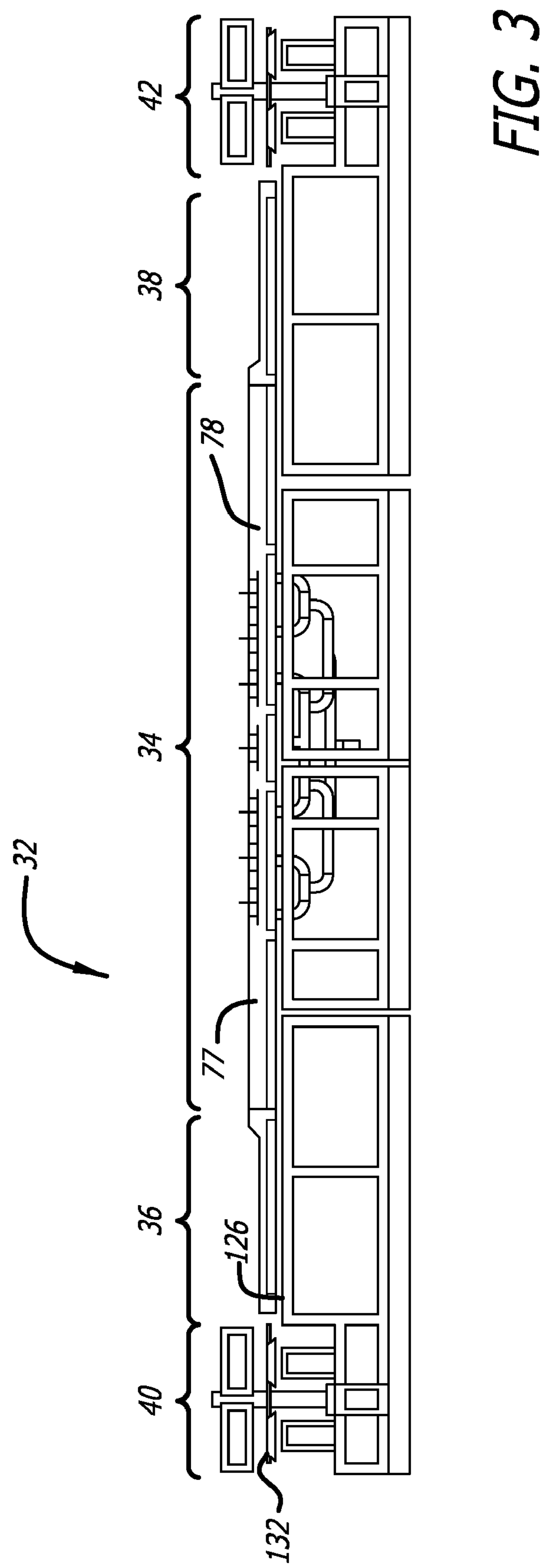
FIG. 3 is an elevational view, that is somewhat schematic, showing the processing line of FIG. 2 in additional detail.

By way of further introduction, the processing line 32 for a chemical vapor deposition system in accordance with the invention is schematically illustrated in FIG. 2, and shown in more detail in elevation, though still somewhat schematically, in FIG. 3. The system conveys substrates, i.e., the foundation structure, which may thus include layered materials, on which the system operates, along a conveyance line. There is a chemical vapor deposition section 34 in the middle, subject to vacuum conditions (apart from inlet materials), a vacuum interlock and preheat section 36 prior to the chemical vapor deposition section, and a cooling and vacuum interlock section 38 after that deposition section. There is a stack loader 40 at the start of the line that unloads substrates, for example 12 substrates, from one loading and unloading stack section, and then can move that section out of the way and replace it with a second fully-loaded stack section that was loaded while the first section was unloading. Thus, unloading of the two sections alternates, as does the loading, in a way and at a rate to provide sufficient substrate units to satisfy the speed of operation of the system. Loaders of this type and their construction and operation are well-understood by those skilled in the art.

The stack unloader 42 at the back end of the line operates in generally the reverse fashion of the loader 40, stacking processed substrates in one unloader section while unloading substrates previously stacked in the other section.

Figure 4:
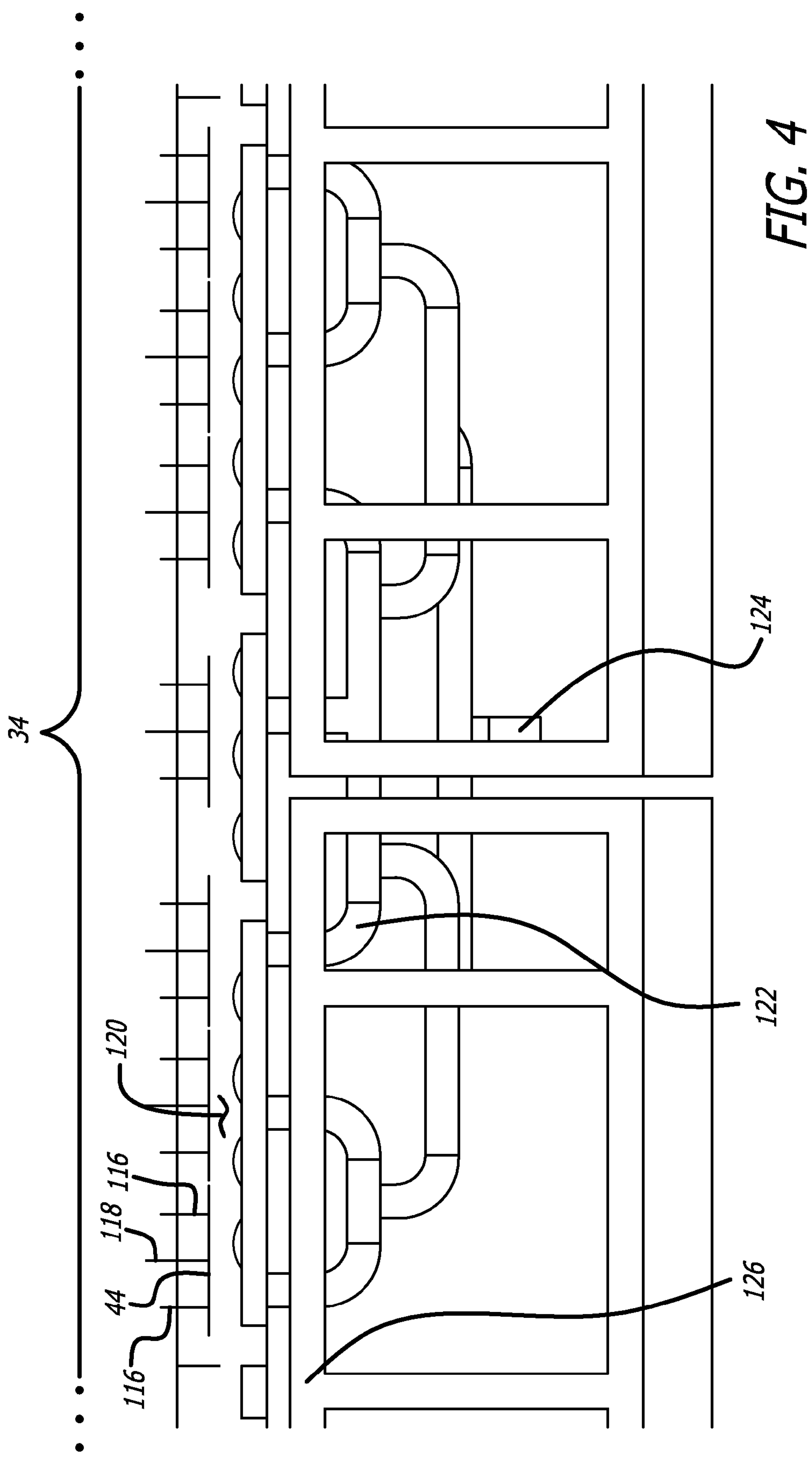
FIG. 4 is an enlarged view of part of FIG. 3.

The process line of FIGS. 2 and 3 has a total of seven chemical vapor deposition heads 44. Although the presence of such heads can be somewhat seen in FIG. 3, FIG. 4, showing an enlarged view of the chemical vapor deposition section shows them somewhat better. However, one such head is shown in substantial detail in FIG. 8, with a number of the layered structures of the head shown in FIGS. 9A through 9C. The process line is an in-line arrangement. Thus, the substrates move along a path encountering one head after the other. Although the path, as shown, is a straight line, conceivably, the in-line arrangement could be on a line that is curved or otherwise changes directions.

Figure 8:
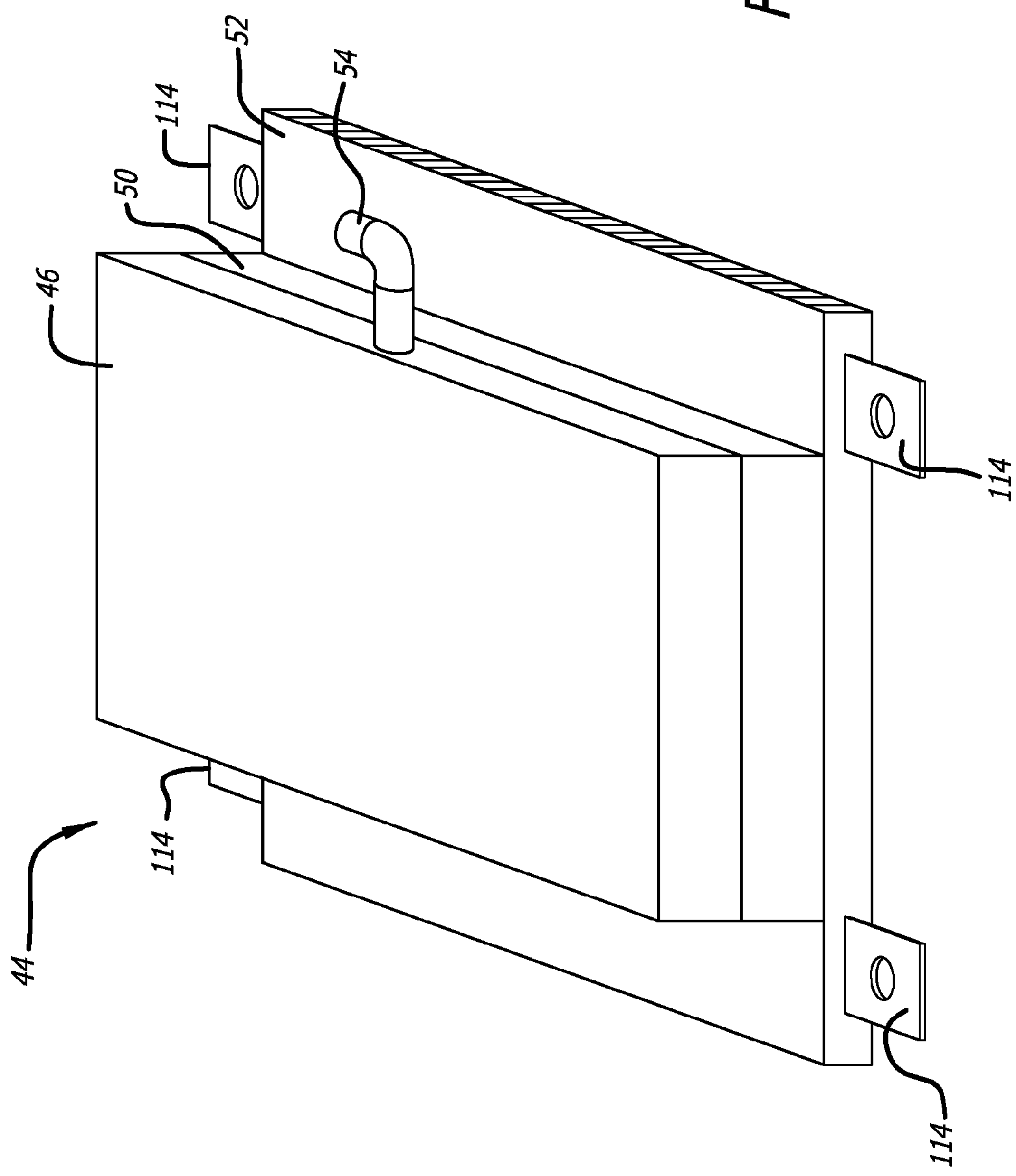
FIG. 8 is a perspective view of a deposition head for each of the deposition regions of the processing line of FIGS. 2 and 3.

Referring to FIG. 8, the heads 44, which for the process line of FIG. 3 are all the same, each have three structural layers providing three plenum layers. Thus, there is a top structural layer 46, a middle structural layer 50 and a bottom structural layer 52. The top structural layer has an inlet fitting 54 for the flow of gas (carrying vapor) into the plenum of that layer; and the middle structural layer has a like fitting (not shown in FIG. 8) for the flow into its plenum.

Figure 6:
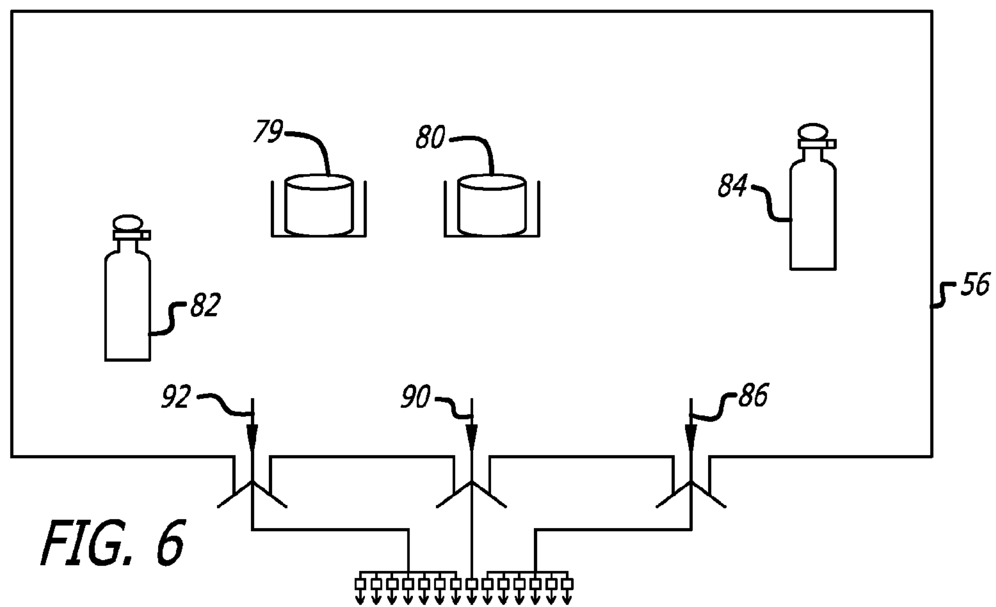
FIG. 6 is a schematic drawing illustrating the chemical material supply apparatus and the distribution of the chemical material to seven heads for each of the seven deposition regions for the processing line of FIGS. 2 and 3.

The material supply apparatus 56 of the chemical vapor deposition system, for the chemical vapor section 34 of the processing line 32, is schematically illustrated in FIG. 6. The providing of the material flow to the heads is also illustrated in FIG. 6. The material flow for one typical form of operation is indicated there, with the middle layer plenum of each of the heads receiving the same constituents and rate of flow, as do the top layer plenums of the last six of the heads. However, the top layer plenum of the first of the heads receives a flow that is varied from that received by the top layer plenums of the six heads that follow. These matters, however, can be varied in any desired fashion.

Figure 9A:
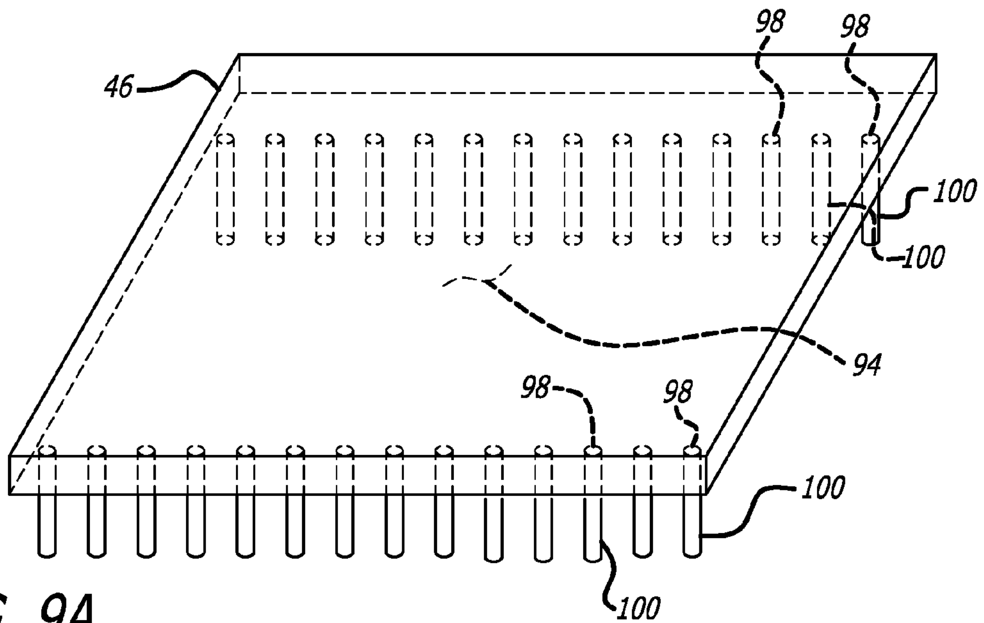
FIG. 9A is a perspective view showing the top plenum layer of the deposition head of FIG. 8, prior to being joined with the other layers.
Figure 9B:
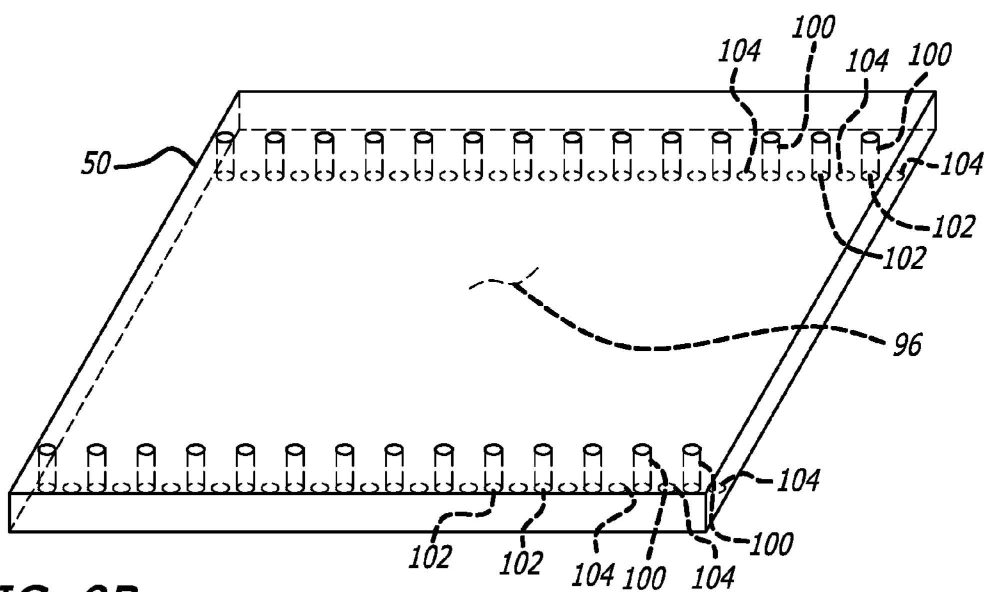
FIG. 9B is a perspective view showing the middle plenum layer of the deposition head of FIG. 8, prior to being joined with the other layers.
Figure 9C:
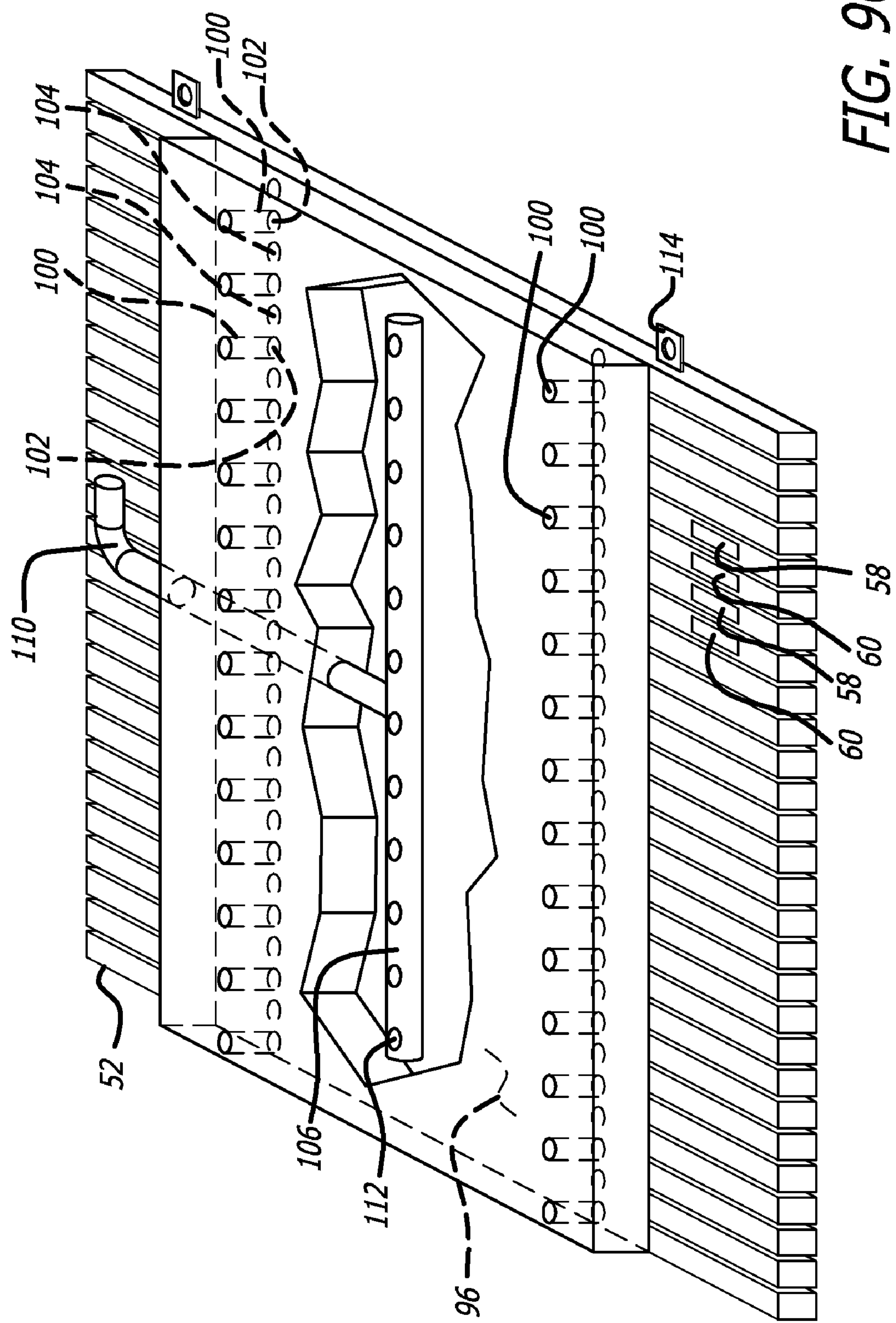
FIG. 9C is a perspective view showing the bottom, emitting and distribution plenum layer of the deposition head of FIG. 8, with the middle layer joined to it in position, partially broken away, with the middle layer's internal exit openings, as well as conduits from the top layer, represented by dashed lines, and with its gas inlet conduit also shown.
Figure 10A:
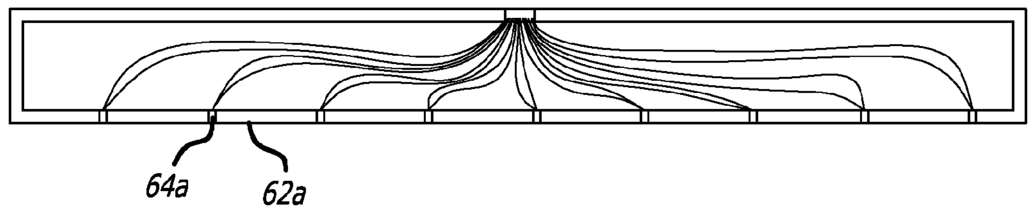
FIG. 10A shows a portion of an elongated plenum similar to those in the emission and distribution plenum layer of FIG. 9C, illustrating the modeling of flow from one of two upper entrance openings to a number of emission and distribution openings.
Figure 10B:
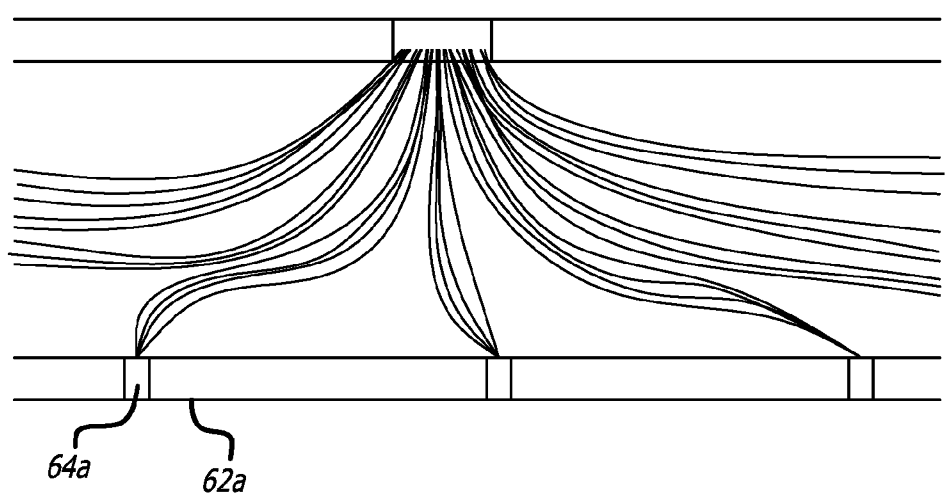
FIG. 10B is an enlarged view of a portion of FIG. 10A.

As is illustrated in FIGS. 9A through 9C and 10A and 10B, with 9C somewhat broken away, the wall structure of the head provides in the bottom layer, one set of elongated plenums or channels 58 for receiving flow from the top layer plenum and another set of elongated plenums or channels 60 for receiving flow from the middle layer plenum. These elongated plenums provide flow to the emitting and distribution face of the head. This face is formed by the under-faces 62 of the elongated structures that define the elongated plenums, as indicated in FIG. 9C and FIGS. 10A and 10B. This face is a continuous, relatively flat surface, as the elongated structures are joined together side to side (e.g., by welding) with no space between them. The emission and distribution at this face is through a line of relatively small openings 64 along the center of the bottom wall for each elongated plenum. In the embodiment shown, each elongated plenum has these openings arrayed in the same fashion as the other plenums. This, of course, is in accordance with the desired uniformity for purposes of the chemical vapor deposition. FIG. 10A shows approximately half of a like elongated plenum, having nine emitting and distribution openings, in a computer model of the flow of the gas carrying the vapor, with the lines in fact based on the existence of a significant density or density range along those lines. There, the use of nine openings (for half an elongated plenum) is provided simply for convenience of illustration. Therefore, the emitting and distribution under-face and the openings for the plenum are respectively designated 62*a* and 64*a*. An actual total of 14 openings for a full elongated plenum, with thus seven for half an elongated plenum, is convenient and efficient and, thus, is assumed present in the heads 44 of the process line 32. This type of modeling of matters such as density, velocity and various other flow related variables can be done using available computer programming for fluid dynamics modeling.

Figure 5:
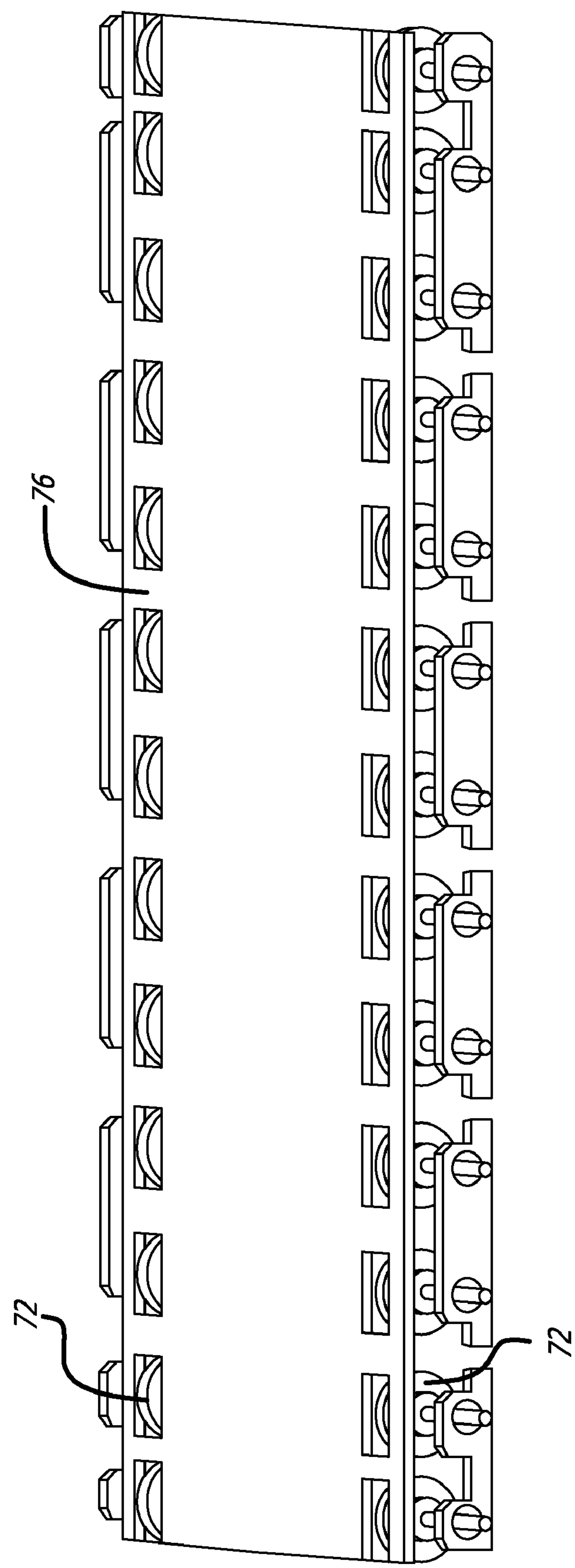
FIG. 5 is a perspective view showing a heating plate or platen along a section of conveyance rollers in the deposition section of the processing line of FIGS. 2 and 3.
Figure 7:
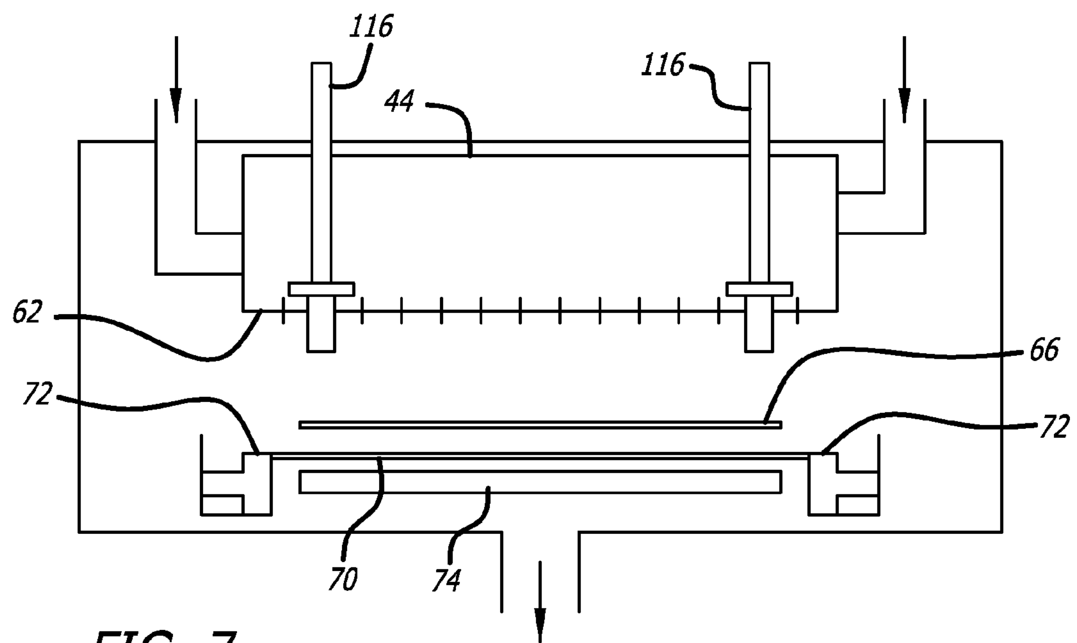
FIG. 7 is a schematic drawing showing a deposition region with its deposition head for providing and distributing chemical vapor, and a number of other components in that region.

FIG. 7 schematically illustrates, for a view of the chemical vapor deposition chamber taken across the width of the process line, a head 44, a substrate 66, a tray 70 that acts as a substrate holder and carrier, rollers 72, and a heater coil 74. In FIG. 5, a perspective view of a heater plate or platen 76 is shown in position in relation to the rollers 72, with their side mounting plates and axles. The heater coil is arranged slightly below the plate or platen without touching it. This roller arrangement, and heating arrangement, exists along the chemical vapor deposition section 34, including along an initial buffer region 77 and a final buffer region 78, which aid in creating the stable environment for the substrates within the section. These roller arrangements can be seen, somewhat schematically, in FIGS. 4 and 3.

The above introductory and summary description, in connection with the drawings, of course, provides a substantial amount of detail about the chemical vapor deposition system, its parts and method of operation, and variations in such parts and operation.

As for additional detailed aspects, turning to the schematically illustrated gas supply apparatus in FIG. 6, in this deposition system, zinc oxide is formed by the following chemical reaction: $Zn(C_2H_5)_2+H_2O{=\!=}ZnO+2C_2H_6$. For depositing a zinc oxide (ZnO) layer, with boron to enhance its electrical conductivity, diethyl zinc vapor is conveniently supplied by bubbling nitrogen carrier gas through a liquid diethyl zinc container, and water vapor is conveniently supplied by bubbling nitrogen carrier gas through a liquid water container. The boron dopant for the zinc oxide is conveniently supplied form a tank of diborane gas. This is illustrated in FIG. 6, with a supply of liquid diethyl zinc 79, a supply of liquid water 80, a supply or supplies of nitrogen gas 82 for bubbling through the liquids and carrying them in vapor form, and a source of diborane gas 84. This gas supply apparatus of FIG. 6 is conventionally implemented using, e.g., conventional flow regulation, measurement, and control devices.

Still referring to FIG. 6, there, then, are shown three outflow arrows representing three different flows of chemical material. Represented at the right through right arrow 86 is nitrogen carrying one mix of diethyl zinc vapor and diborane to the inlets of the top layer plenums for each of the seven heads 44, except the first head. Then the middle arrow 90 represents a different mix of these materials flowing to the inlet of the top layer plenum of the first head. In a particular typical situation, the idea is to provide somewhat less diborane to decrease the electrical conductivity of the deposited layer near the immediate junction with the lower layer. Then, the left arrow 92 represents a uniform flow of water vapor, carried by nitrogen, to the middle layer plenums of each of the seven heads. Thus, in accordance with the form of the head 44, the diethyl zinc with borane is maintained separate from the water vapor until each exits the emission and distribution face of the head through the small openings in its set of elongated plenums.

FIGS. 9A, 9B and 9C show how the flow of the diethyl zinc vapor and diborane, carried by nitrogen, travels from the top plenum 94 within the top structural layer of the deposition head 46 (the volume of such plenum essentially defined by the outer walls for the top layer), passing through the middle plenum 96 within the middle structural layer of the head 50, into the elongated set of plenums 58 within the bottom structural layer of the head 52, that receive and then emit and distribute that flow. Specifically, wall structure of the head creates a set of sealed flow paths, arranged along two lines, for this flow. Each sealed flow path for this set, starts at an opening at the bottom of the top structural layer, runs through a circular conduit 100 that starts at the bottom of the top layer, extends through the middle layer, and leads to openings 102 at the bottom of the middle layer, that open into the elongated set of plenums 58 of the bottom layer for the flow from the top layer. This flow is sealed so that there is no mixture with flow to or from the middle layer plenum. This sealing can be conveniently accomplished using a stainless steel material for the head, making the conduits and the openings appropriately tight fits, and using welding, with the added use of an epoxy material at welding locations to seal the flow. An aluminum material is another example of material that could be used for the head, though perhaps not as conveniently for this purpose. Of course, if desired, the conduits could extend somewhat beyond the openings for receiving them at either end, thus somewhat beyond the horizontal walls for such openings.

With respect to the flow of the water vapor, carried by nitrogen, into the middle layer plenum 96, this is maintained separate from the flow from the top plenum, simply, by providing a set of openings 104 arrayed along two lines at the bottom of the middle plenum layer 50. Then, along each line, the openings at the bottom of the middle plenum layer for the flow from the middle layer plenum, alternate with the openings for the flow from the first layer plenum 94 through the set of conduits 100 from the first layer. And, in accordance with this, and in the embodiment shown, there are two openings into each elongated plenum for the entering flow into the plenum. For elongated plenum wall structures of about 14" (35.6 cm) long, openings ⅜" (0.953 cm) in diameter, centered about 5" (12.7 cm) from the ends constitute a convenient arrangement. Further, in regard to the middle layer plenum 96, its volume is essentially defined by the outer walls for the layer reduced by the volume taken by the circular conduits 100.

With the plenum layers separately formed and then joined by welding, the horizontal walls between the plenums are formed from two walls coming together. However, this certainly need not be the case. Thus, a single wall could readily be used during fabrication. The analogous situation applies to the vertical walls between the elongated plenums of the third plenum layer.

The inlet flow into the middle layer plenum 96 is illustrated in FIG. 9C. As can be seen, the internal openings and conduits for flow to the bottom layer are shown largely in dashed form. However, in part through the broken away top wall, an inlet conduit 106 from the inlet fitting 110 for the middle layer is shown. That inlet conduit, also, is conveniently made of aluminum and welded into position. It has a circular shape and has a series of inlet openings 112, along the top of the conduit, for the flow into the middle plenum 96. The provision for flow into the top plenum 94 (FIG. 9A) through the top plenum layer fitting 54 (FIG. 8) has the same form and construction with, of course, the arrangement coming in at the other side of the head, starting from that fitting 54, and leading into the other inlet conduit, for the top plenum. These inlet conduits within the plenums have a size and position so as to avoid contact in the plenums themselves with the insides of the walls—for example, a ½" (1.27 cm) diameter.

The chemical vapor deposition system, as a whole, is adapted to be scaled to larger and faster production. The embodiment shown in the application is particularly adapted for use with square substrates that are approximately 12" (30.5 cm) on a side, with the bottom layer of the head, 14" (35.6 cm) by 14" (35.6 cm), with 14 small emitting and distribution openings along the length of the emitting and distributing under-face 62 of each elongated plenum (see FIG. 7 and, also, FIGS. 10A and 10B), and with these openings having a diameter of 0.044" (0.11 cm), and centered ¾" (1.91 cm) apart. But, again, the design is adapted to be scaled for increased size while maintaining the type of emission and distribution required. For example, the spacing and size of the emitting and distribution openings can be maintained the same, even with a larger size head, and the number of flow openings into each of the elongated plenums could be maintained the same or increased in number. Concerning scaling, as one example, the substrates could be squares having twice the length per side indicated above, thus having an area four times as great. Then, two process lines could be operated together for total scaling eight times as great. Also, employing substrates that have an area at least equal to that of a square of 9" (22.9 cm) on a side, thus having an area greater than or equal to 81 $in^2$ (523 $cm^2$), would be advisable in order to reasonably exploit the design. Similarly, a minimum of five deposition regions, and a total length of deposition regions of greater than or equal to 7 feet (2.1 m) would similarly be advisable. As another simple scaling example, for an increased rate of production, an appropriate number of additional heads can be added, extending the process line, and thus permitting a corresponding increase in the speed of travel of the substrates.

For the embodiment shown, the elongated plenums are particularly adapted to be about ½" (1.27 cm) wide and ¾" (1.91 cm) high; and the top and middle structural plenum layers are particularly adapted to be 9" (30.5 cm) wide and 14" (35.6 cm) long. Further, the heads 44 are particularly adapted to have a bottom structural layer ¾" (1.91 cm) high, and top and middle structural layers 1" (2.54 cm) high. Additionally, a typical range of separation between the bottom of a head and a substrate is ½" (1.27 cm) to 4" (10.2 cm). Although a variety of fittings for the inflow to the top and middle plenums can be used, a ½" (1.27 cm) female VCR fitting is convenient and efficient.

A variety of methods may be used to mount the chemical vapor deposition heads 44 in the chemical vapor deposition section 34 of the process line 32. However, in the embodiment shown, four internally threaded brackets 114 extend from the bottom structural layer 52 of the head (FIG. 8), and threaded studs are then threaded into these brackets to mount the head, with the studs passing through and mounted to a top plate for the vapor deposition chamber at the region for the particular head. Thus, each such region can have a separate mounting plate for convenient construction and maintenance, which is sealed in position in closing the chamber at the region of concern. A variety of connections, such as a simple nut on either side of each bracket (and also on either side of the mounting plate) can be used to accomplish the mounting of the head and to allow variable positioning of the head upwardly or downwardly in the chamber. In the schematic illustration of FIG. 7 and the elevational, somewhat schematic drawing of FIG. 4, two of the four studs 116 for each head can be seen. Of course, the number of brackets and studs can be readily varied. In FIG. 7, the openings through the emission and distribution face at the bottom of the deposition head are conveniently illustrated with short vertical lines. In FIG. 4, one of two mounted conduit inlet fittings 118 for each head can also be seen. Such a mounted inlet fitting is conveniently provided using a hard conduit fitting through the top wall of the deposition section 34, with flexible tubing internally to it, carrying the flow to one of the two inlet fittings 54 or 110 at the head.

In FIG. 4, with seven heads 44, it is readily apparent that each head has a deposition region 120 for that head immediately below the emitting and distributing face for the head. In addition, each such region has an exhaust pipe 122 generally under the head for that region. Then there is a branched exhaust pipe arrangement in which an exhaust branch for each region comes together with the exhaust for one or two other regions, forming two branches that come together, ultimately leading to a single main exhaust pipe 124 for the vapor deposition section of the process line, to which an exhaust pump (not shown) can be connected. Additionally, of course, the arrangement 126 of some of the larger structural members providing support for the process line is represented in FIGS. 3 and 4. The regions can conveniently be separated by baffles, in the form of thin vertical walls, extending down from the top of the chamber, e.g., to about 1¼" (3.18 cm) above the substrate surfaces. As can be seen by reference to FIG. 4, the deposition heads 44, and deposition regions 120, certainly can be, but need not be, evenly spaced. In FIG. 4, the center head 44 and region 120 happen to have somewhat larger spaces on either side of them. This can be a function of how multiple parts of the process line are initially fabricated and then joined together.

In the embodiment shown, trays that sit on and move along the rollers 72 are used to carry the substrates, with, e.g., the rollers in the deposition section carrying the trays through operation of a motor and chain arrangement (not shown). These trays each hold three substrates that then move together in a tray. The substrates are placed on the trays, three per tray, at the stack loader 40, and removed from the trays, three per tray, at the stack unloader 42. Such a tray 70 is schematically represented in FIG. 7, and a tray with three loaded substrates 132, on two lengths of rollers, is represented at the stack loader 40 in FIG. 3. Preferably, the tray has open framing, covered by a screen, with the substrates supported near corners of the frame to otherwise leave a small space between their undersides and the frame. Of course, this type of arrangement supports the uniform distribution of heat and the uniform distribution of the inlet flow, as aided and affected by the exhaust for the process line. The screen will catch substrate pieces in the event a substrate breaks, thus minimizing the clean-up and maintenance problems that would otherwise occur from such breakage.

With regard to the platens and the heater coils, with such a heater coil 74 shown schematically in FIG. 7, and such a platen 76, in the chemical vapor deposition chamber, shown in FIG. 5, the heater coils may be standard resistive coils having a serpentine configuration. With regard to the platens, it has been found that the deposition of the zinc oxide material, in fact, can enhance the long wavelength emissivity of the platens in the deposition section, in providing the temperature maintenance of the traveling trays in the deposition section. Specifically, the additional heat insulation provided to an aluminum platen by the zinc oxide material enhances the performance of the platen. However, this would appear to be the case only up to a point, such as in the range of 6 microns (0.24 mil) of thickness of ZnO material. When the zinc oxide material becomes too thick, as part of the servicing of the system, the material may be scraped off to the appropriate thickness.

Providing a smaller amount of diborane, thus less boron doping in the first deposition region, and then a uniform larger amount in each of the next six deposition regions is advantageous, although, this can be readily varied. Although the number of deposition regions shown may not be exactly adapted for the timing of the deposition of the lower level of diborane versus the upper level, the following are exemplary values for the deposition time and rate of flow for the initial mix with a lower amount of diborane, and for the later mix with a higher amount of diborane, along with an appropriate range of values, and the same for the uniform rate of flow of water vapor, with "SCCM" of course meaning standard cubic centimeters.

TWO-STEP DEPOSITION

| | | VALUES | RANGE OF VALUES |
|---|---|---|---|
| FIRST MIX | time | 2 minutes | 0.5-3.0 minutes |
| | $Zn(C_2H_5)_2$ | 100 sccm | 50-200 sccm |
| | $B_2H_6$ | 2.4 sccm | 1.5-5.0 sccm |
| | $H_2O$ | 120 sccm | 50-250 sccm |
| LATER MIX | time | 10 minutes | 2.0-20.0 minutes |
| | $Zn(C_2H_5)_2$ | 100 sccm | 50-200 sccm |
| | $B_2H_6$ | 10 sccm | 5.0-20.0 sccm |
| | $H_2O$ | 120 sccm | 50-250 sccm |

A typical range of pressures in the vapor deposition section at the surfaces of the substrates would be from 0.5 torr or to 2.5 torr, with a typical temperature range from 150° C. to 225° C., and a typical range of thickness for the ZnO material layer of from 1.2 micrometer (0.047 mil) to 1.7 micrometers (0.067 mil). Also, given the above chart, setting a total period for the deposition of material at a given substrate location in the deposition regions of less than 25 minutes, or, alternatively, less than 15 minutes is reasonable.

This system can also be used or adapted to deposit thin layers of zinc sulfide (ZnS) that are used to fabricate solar cells in a different configuration. Somewhat analogously to ZnO, ZnS can be deposited using the chemical reaction between diethyl zinc and hydrogen sulfide gas ($H_2S$), instead of water vapor, as follows: $Zn(C_2H_5)_2+H_2S=ZnS+2C_2H_6$. Exemplary process parameters, analogous to those given above for a ZnO material layer but for the deposition of ZnS at 300° C., with a pressure range from 1.3 torr to 2.0 torr, are as follows:

| | VALUES | RANGE OF VALUES |
|---|---|---|
| time | 5 minutes | 2.0-20.0 minutes |
| $Zn(C_2H_5)_2$ | 100 sccm | 50-200 sccm |
| $H_2S$ | 180 sccm | 50-250 sccm |

Turning back to FIG. 3, the vacuum interlock and preheat section 36 provides the transition between the stack loader subject to the normal ambient atmosphere and the highly controlled atmosphere, based on the establishment of a vacuum, in the chemical vapor deposition chamber of the deposition section 34. Thus, preheating of the substrates occurs there. In addition, that section is open to the ambient atmosphere at the stack loader when the loading of that section with a tray of substrates occurs, but then establishes an internal atmosphere consistent with the vacuum-based chemical vapor deposition before it is opened to the chemical vapor deposition section for conveying of the set of substrates into that section. Similarly, the opposite occurs at the vacuum interlock and cooling section 38, with that section being closed to the chemical vapor deposition section before a tray of processed substrates is transferred to the stack unloader 42. And cooling, then, also, occurs in that vacuum interlock and cooling section. Also, of course, the vacuum interlock and preheat section 36, and the vacuum interlock and cooling section, have roller arrangements similar to and that cooperate with the arrangement in the chemical vapor deposition section 34.

Although the process and system has been described in detail, with a specific focus on the deposition of a boron doped ZnO layer, it will be readily apparent, that the method and system also can be used for depositing a variety of other layers, e.g., that may be useful in semiconductor devices, including solar cells. Examples of this are: a ZnS or ZnSe layer using $H_2S$ or $H_2Se$ gas rather than water vapor, with ZnS already addressed above; $Zn_2$ $In_2O_5$, using $In(C_2H_6)_3$ along with water vapor; $Zn_2$ $Ga_2O_5$, using Ga $(C_2H_6)_3$ along with water vapor. Also to obtain aluminum doping, $Al(C_2H_5)_3$ or $Al(CH_3)_3$ can be used with water vapor to form $Al_2O_3$ dopant, rather than, e.g., the use of boron dopant.

Further, additional readily apparent alternatives are dimethyl zinc vapor ($Zn(CH_3)_2$), rather than diethyl zinc vapor as the source of zinc, trimethyl boron or triethyl boron gas, rather than diborane gas, as the source of boron dopant, and nitrous oxide gas (NO), rather than water vapor, as the source of the oxygen.

Finally, a broader range of temperatures, at the substrate deposition surfaces, for the broader range of material layers is from 100° C. to 450° C., and a similarly broader range of material thickness is from 0.1 micrometer (0.0039 mil) to 3.0 micrometer (0.12 mil). The pressure range given for the ZnO material layer also applies to the broader range of material layers. Additionally, for extremely thin layers, the layer of material may be deposited at a location on a substrate, in a period of time as small as a few seconds.

From, and in accordance with, the foregoing, it will be apparent to those skilled in the art that many modifications and variations may be made in the matters which have been described in detail without departing from the spirit or scope of the invention.

We claim:

1. A method of chemical vapor deposition of layers of material on substrates for producing semiconductor devices, comprising the steps of:

continuously conveying a plurality of substrates through a plurality of in-line deposition regions;

continuously providing and distributing a chemical vapor at each said region to deposit material for the layers, including, delivering chemical materials to a first plenum in a first plenum layer and to a second plenum in a second plenum layer, said chemical materials separated between said plenums, said separated chemical materials capable of reacting when not separated, delivering chemical materials from said first and second plenums to a third plenum layer and maintaining said separation in said third plenum layer, said delivery of chemical materials from said first plenum to said third plenum layer including passing chemical materials from said first plenum through said second plenum layer, and emitting and distributing said separated chemical materials from said third plenum layer into said region;

continuously supplying a flow of chemical materials for said first and second plenums, for each said region.

2. A method of chemical vapor deposition as defined in claim 1, wherein:

said chemical vapor for deposition at each of said regions covers an area greater than or equal to about 81 $in^2$ (523 $cm^2$).

3. A method of chemical vapor deposition as defined in claim 1, wherein:

each of said substrates has an area for said deposition of greater than or equal to about 81 $in^2$ (523 $cm^2$).

4. A method of chemical vapor deposition as defined in claim 1, wherein:

said deposited layers of material have thicknesses of greater than or equal to about 1.2 micrometer (0.047 mil) and less than or equal to about 1.7 micrometer (0.067 mil).

5. A method of chemical vapor deposition as defined in claim 1, wherein said deposited layers of material have thicknesses of greater than or equal to about 0.1 micrometer (0.0039 mil) and less than or equal to about 3.0 micrometer (0.12 mil).

6. A method of chemical vapor deposition as defined in claim 1, wherein:

the layer of material is deposited at a location on each of said substrates at said deposition regions, in a period of time that is less than or equal to about 25 minutes.

7. A method of chemical vapor deposition as defined in claim 1, wherein:

the pressure at the deposition surface of each of said plurality of substrates at said deposition regions is greater than or equal to about 0.5 ton and less than or equal to about 2.5 torr.

8. A method of chemical vapor deposition as defined in claim 1 wherein:

the temperature at the deposition surface of each of said plurality of substrates at said deposition regions is greater than or equal to about 150° C. and less than or equal to about 225° C.

9. A method of chemical vapor deposition as defined in claim 1, wherein:

the temperature at the deposition surface of each of said plurality of substrates at said deposition regions, is greater than or equal to about 100° C. and less than or equal to about 450° C.

10. A method of chemical vapor deposition as defined in claim 1, wherein:

said chemical vapor includes an organometallic material.

11. A method of chemical vapor deposition as defined in claim 10, wherein:

said organometallic material includes diethyl zinc vapor.

12. A method of chemical vapor deposition as defined in claim 10, wherein:

said organometallic is selected from the group consisting of diethyl zinc vapor and dimethyl zinc vapor.

13. A method of chemical vapor deposition as defined in claim 1, wherein:

said chemical vapor includes water vapor.

14. A method of chemical vapor deposition as defined in claim 1, wherein:

said chemical vapor includes a constituent selected from the group consisting of water vapor, nitrous oxide gas and hydrogen sulfide gas.

15. A method of chemical vapor deposition as defined in claim 1, wherein:

the atmosphere for said chemical vapor for one or more of said regions includes material that provides a dopant for said layers of material.

16. A method of chemical vapor deposition as defined in claim 1, wherein:

said layers of material include zinc oxide.

17. A method of chemical vapor deposition as defined in claim 16, wherein:

said layers of material include zinc oxide doped with boron.

18. A method of chemical vapor deposition as defined in claim 1, wherein:

said deposition regions number at least 5.

19. A method of chemical vapor deposition as defined in claim 1, wherein:

said emitting and distributing into said region includes maintaining the mixtures of said separated chemical materials from said third plenum layer in entering said region.

20. A method of chemical vapor deposition as defined in claim 1, wherein:

said delivering and maintaining includes maintaining the temperatures of said chemical materials within said third plenum layer actively unaffected by a temperature change source directed to said third plenum layer while said chemical materials are within said third plenum layer.

21. A method of chemical vapor deposition as defined in claim 1, wherein:

said emitting and distributing into said region includes maintaining the mixtures of said separated chemical materials from said third plenum layer in entering said region, and said delivering and maintaining includes maintaining the temperatures of said chemical materials within said third plenum layer actively unaffected by a temperature change source directed to said third plenum layer while said chemical materials are within said third plenum layer.

22. A method of chemical vapor deposition as defined in claim 1, wherein:

said layers of material include zinc sulfide.

23. A method of chemical vapor deposition as defined in claim 1, wherein:

said passing of chemical materials from said first plenum through said second plenum layer includes passing said chemical materials through said second plenum of said second plenum layer.

24. A method of chemical vapor deposition as defined in claim 23, wherein:

said passing of chemical materials from said first plenum through said second plenum of said second plenum layer includes sealing said chemicals from said second plenum during said passing through.

25. A method of chemical vapor deposition as defined in claim 1, wherein:

said maintaining of said separation in said third plenum layer includes maintaining, in said third plenum layer, chemical materials from said first plenum in one set of elongated plenums of said third plenum layer, and maintaining, in said third plenum layer, chemical materials from said second plenum in a second set of elongated plenums of said third plenum layer.

26. A method of chemical vapor deposition of layers of material on substrates for producing semiconductor devices, comprising the steps of:

continuously conveying a plurality of substrates through a plurality of in-line deposition regions;

continuously providing and distributing a chemical vapor at each said region to deposit material for the layers, including, delivering chemical materials to a first plenum in a first plenum layer and to a second plenum in a second plenum layer, said first and second plenums having generally planar configurations, said first plenum layered generally over said second plenum, said chemical materials separated between said plenums, said separated chemical materials capable of reacting when not separated, delivering chemical materials from said first and second plenums to a third plenum layer and maintaining said separation in said third plenum layer, and emitting and distributing said separated chemical materials from said third plenum layer into said region;

continuously supplying a flow of chemical materials for said first and second plenums, for each said region.

27. A method of chemical vapor deposition as defined in claim 26, wherein:

said third plenum layer includes a plurality of elongated plenums arranged in a generally planar configuration, layered generally under said second plenum.

28. A method of chemical vapor deposition as defined in claim 26, wherein:

each of said substrates has an area for said deposition of greater than or equal to about 81 $in^2$ (523 $cm^2$).

29. A method of chemical vapor deposition as defined in claim 26, wherein:

the layer of material is deposited at a location on each of said substrates at said deposition regions, in a period of time that is less than or equal to about 25 minutes.

30. A method of chemical vapor deposition as defined in claim 26, wherein:

said layers of material include zinc oxide.

31. A method of chemical vapor deposition as defined in claim 26, wherein:

said deposition regions number at least 5.

32. A method of chemical vapor deposition as defined in claim 26, wherein:

said emitting and distributing into said region includes maintaining the mixtures of said separated chemical materials from said third plenum layer in entering said region, and said delivering and maintaining includes maintaining the temperatures of said chemical materials within said third plenum layer actively unaffected by a temperature change source directed to said third plenum layer while said chemical materials are within said third plenum layer.

33. A method of chemical vapor deposition as defined in claim 26, wherein:

said layers of material include zinc sulfide.

* * * * *

UNITED STATES PATENT AND TRADEMARK OFFICE

CERTIFICATE OF CORRECTION

PATENT NO. : 8,071,165 B2
APPLICATION NO. : 12/188468
DATED : December 6, 2011
INVENTOR(S) : Vijay K. Kapur et al.

It is certified that error appears in the above-identified patent and that said Letters Patent is hereby corrected as shown below:

Column 12, line 20, delete “ton” and insert instead --torr--.

Signed and Sealed this
Thirteenth Day of March, 2012

David J. Kappos
*Director of the United States Patent and Trademark Office*